US008644995B2

(12) United States Patent
Hinman et al.

(10) Patent No.: US 8,644,995 B2
(45) Date of Patent: Feb. 4, 2014

(54) WIRELESS LOCAL AREA NETWORK FOR A CONCENTRATED PHOTOVOLTAIC SYSTEM

(75) Inventors: Brian Hinman, Los Gatos, CA (US); Roeland Vandevelde, American Canyon, CA (US)

(73) Assignee: Western Gas and Electric Company, Thousand Oaks, CA (US)

( * ) Notice: Subject to any disclaimer, the term of this patent is extended or adjusted under 35 U.S.C. 154(b) by 328 days.

(21) Appl. No.: 13/227,684

(22) Filed: Sep. 8, 2011

(65) Prior Publication Data

US 2012/0158197 A1 Jun. 21, 2012

Related U.S. Application Data

(60) Provisional application No. 61/424,537, filed on Dec. 17, 2010, provisional application No. 61/424,515, filed on Dec. 17, 2010, provisional application No. 61/424,518, filed on Dec. 17, 2010, provisional application No. 61/424,493, filed on Dec. 17, 2010.

(51) Int. Cl.
*G05D 3/12* (2006.01)
*H04H 40/00* (2008.01)
*G01C 21/02* (2006.01)
*H02N 6/00* (2006.01)
*G06F 15/16* (2006.01)

(52) U.S. Cl.
USPC ......... 700/286; 700/287; 455/3.01; 455/3.06; 136/246; 250/203.4; 126/601; 709/203; 709/217; 709/219

(58) Field of Classification Search
None
See application file for complete search history.

(56) References Cited

U.S. PATENT DOCUMENTS

| 7,734,380 B2* | 6/2010 | Ransom et al. ............... 700/286 |
| 2009/0160189 A1* | 6/2009 | Rasmussen .................... 290/44 |
| 2010/0006140 A1* | 1/2010 | Parker et al. .................. 136/246 |

* cited by examiner

*Primary Examiner* — Sean Shechtman
(74) *Attorney, Agent, or Firm* — Rutan & Tucker, LLP (57) ABSTRACT

Various methods and apparatus are described for a photovoltaic system. In an embodiment, a method for performing auto-configuration of a concentrated photovoltaic (CPV) array installed in a solar site having multiple CPV arrays. The central backend management system sends auto-configuration files over the Internet to each of the two-axis tracking mechanisms installed at the solar site based upon the GPS coordinates of each of the two-axis tracking mechanisms and that two-axis tracking mechanism's relative position in the layout of the two-axis tracking mechanisms located at the solar site.

19 Claims, 8 Drawing Sheets

WIRELESS LOCAL AREA NETWORK FOR A CONCENTRATED PHOTOVOLTAIC SYSTEM

RELATED APPLICATIONS

This application claims the benefit under 35 USC 119 of and priority to U.S. Provisional Application titled "INTEGRATED ELECTRONICS SYSTEM" filed on Dec. 17, 2010 having application Ser. No. 61/424,537, U.S. Provisional Application titled "TWO-AXIS TRACKER AND TRACKER CALIBRATION" filed on Dec. 17, 2010 having application Ser. No. 61/424,515, U.S. Provisional Application titled "PV CELLS AND PADDLES" filed on Dec. 17, 2010 having application Ser. No. 61/424,518, and U.S. Provisional Application titled "ISIS AND WIFI" filed on Dec. 17, 2010 having application Ser. No. 61/424,493.

NOTICE OF COPYRIGHT

A portion of the disclosure of this patent document contains material that is subject to copyright protection. The copyright owner has no objection to the facsimile reproduction by anyone of the interconnect as it appears in the Patent and Trademark Office Patent file or records, but otherwise reserves all copyright rights whatsoever.

FIELD

Embodiments of the present invention generally relate to the field of solar power, and in some embodiments, specifically relate to using a wireless local area network in a solar site.

BACKGROUND

A solar site may include many devices. Each of these devices may be able to provide useful information. There has not been an efficient technique to collect this useful information.

SUMMARY

Various methods and apparatus are described for a concentrated photovoltaic (CPV) system. In an embodiment, wireless communication may be used to enable communication between the solar site and a backend central management system. There may be a plurality of CPV arrays located at the solar site. Each of the CPV arrays is coupled with a different system control point (SCP). The SCP communicatively connects to a local area network (LAN) for that solar site. A first CPV array is contained on a two-axis tracker mechanism that generates alternating current (AC) voltage output. The two-axis tracker mechanism has a housing for a first SCP that also includes tracker motion control circuitry and electrical power generating circuitry that generates alternating current (AC) voltage output. The first CPV array is associated with a first global positioning system (GPS) circuitry, which is configured to provide position information of the first CPV array at the solar site. The housing for the first SCP also includes built-in wireless communication circuitry to allow at least the motion control, the electrical power generation and the GPS circuits associated with the SCP to communicate information about the CPV array and two-axis tracker mechanism to a central backend management system over an Internet via a wireless router for the LAN located at the solar site. A second CPV array on a second two-axis tracker mechanism has its own second SCP configured with built-in wireless communication circuitry. At least the motion control, the electrical power generation and the GPS circuits associated with the second SCP communicate information about the second CPV array and two-axis tracker mechanism to the central backend management system over the Internet via the same wireless LAN. Likewise, all of the CPV arrays at the site may wirelessly communicate with each other and with the central backend management system over the wireless LAN.

BRIEF DESCRIPTION OF THE DRAWINGS

The multiple drawings refer to the embodiments of the invention.

While the invention is subject to various modifications and alternative forms, specific embodiments thereof have been shown by way of example in the drawings and will herein be described in detail. The invention should be understood to not be limited to the particular forms disclosed, but on the contrary, the intention is to cover all modifications, equivalents, and alternatives falling within the spirit and scope of the invention.

DETAILED DISCUSSION

In the following description, numerous specific details are set forth, such as examples of specific voltages, named components, connections, types of circuits, etc., in order to provide a thorough understanding of the present invention. It will be apparent, however, to one skilled in the art that the present invention may be practiced without these specific details. In other instances, well known components or methods have not been described in detail but rather in a block diagram in order to avoid unnecessarily obscuring the present invention. Further specific numeric references such as a first array, may be made. However, the specific numeric reference should not be interpreted as a literal sequential order but rather interpreted that the first array is different than a second array. Thus, the specific details set forth are merely exemplary. The specific details may be varied from and still be contemplated to be within the spirit and scope of the present invention.

In general, various methods and apparatus associated with transmitting information from a photovoltaic solar site to a central backend management information system using wireless communication are discussed. In an embodiment, a concentrated photovoltaic (CPV) array management system includes a plurality of concentrated photovoltaic (CPV) arrays located at a solar site. Each of the CPV arrays is coupled with a different system control point (SCP) connected to a local area network (LAN). A first CPV array is contained in a two-axis tracker mechanism that generates alternating current (AC) voltage output, wherein the two-axis tracker mechanism includes tracker motion control circuitry and electrical power generating circuitry. The first CPV array is associated with a first global positioning system (GPS) circuitry that is configured to provide position information of the first CPV array at the solar site. The first CPV array is associated with a first SCP configured with built-in wireless communication circuitry. The first SCP is configured to transmit information about components associated with the first CPV array to a central backend management system via a wireless router located at the solar site. The wireless router and the central backend management system coupled to the Internet. A second CPV array is associated with a second SCP. The second SCP is configured with built-in wireless communication circuitry. The second SCP is configured to transmit information about components associated with the second CPV array to the central backend management system via the wireless router located at the solar site. Likewise, all of the CPV arrays at the site may wirelessly communicate with each other and with the central backend management system over the wireless LAN.

In addition, in an embodiment, auto-configuration of each concentrated photovoltaic (CPV) array installed at the solar site may be performed based upon the Global Positioning System coordinates of each of the two-axis tracker mechanisms. The GPS information indicates the precise geographic position of each two-axis tracker mechanism over the wireless communication network to the wireless router located at the solar site and then over the Internet to the central backend management system. The GPS information is generated by the global position system (GPS) circuitry built into the two-axis tracker mechanism. Each two-axis tracker mechanism has one or more CPV arrays.

The central backend management system identifies each CPV array's geographical position in the set of arrays at the site relative to other CPV arrays located at that solar site by a Latitude and a Longitude being transmitted from the GPS circuitry built into that two-axis tracking mechanism. Auto-configuration files may be sent by the central backend management system over the Internet to the two-axis tracking mechanisms installed at the solar site based upon the GPS coordinates of each of the two-axis tracking mechanisms and that two-axis tracking mechanism's relative position in the layout of the two-axis tracking mechanisms located at the solar site.

Client Computing System

Figure 1:
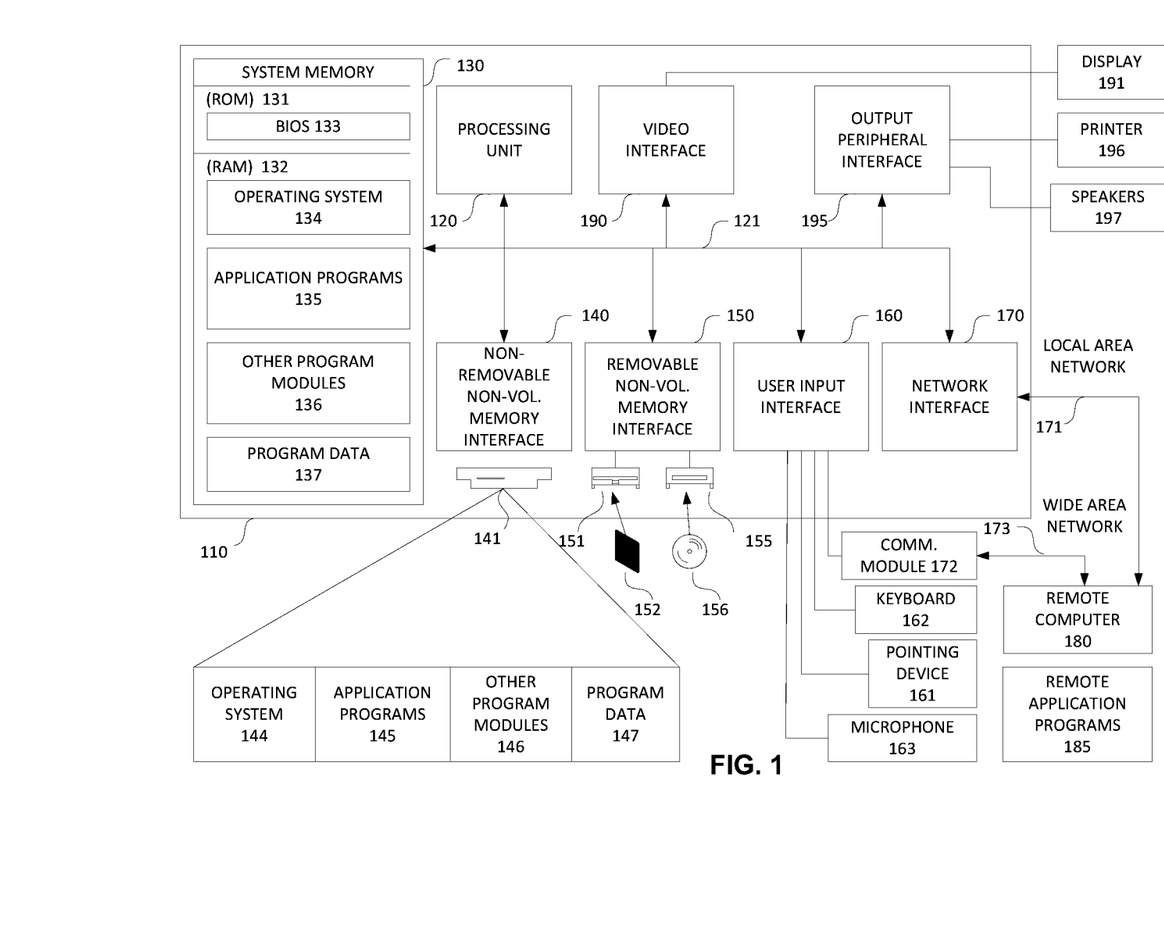
FIG. 1 illustrates a block diagram of an example computing system that may use an embodiment of one or more of the software applications discussed herein.

FIG. 1 illustrates a block diagram of an example computing system that may use an embodiment of one or more of the solar power generation site and wireless local area network concepts discussed herein. The wireless LAN allows transmitting commands, parameters, and other information between each of the two-axis tracker mechanisms and its various components without having to route cables to those tracker mechanisms.

Solar Site Network

Figure 2:
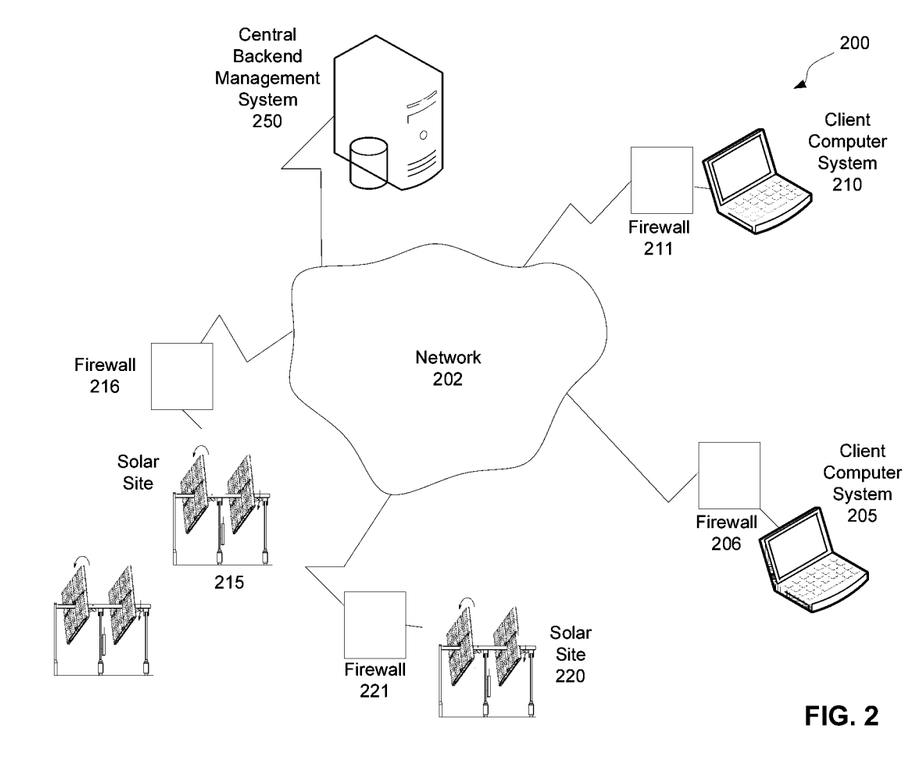
FIG. 2 illustrates a diagram of an embodiment of a network with a central backend management system communicating with multiple solar sites.

FIG. 2 illustrates a diagram of an embodiment of a network with a central backend management system communicating with multiple solar sites. Diagram 200 may include a network 202, which may be the Internet. A central backend management system 250 may be coupled to the network 200 and configured to enable users to control and manage solar sites from anywhere over the network 200. In the current example, solar sites 215, 220 may be coupled to the network 202. There may be a firewall 216 or 221 at each of the respective solar sites 215, 220.

Each of the solar sites 215, 220 may include many photovoltaic arrays. Each of the photovoltaic arrays is contained in a two-axis tracker mechanism that generates an AC voltage output. Tracker motion control circuitry and electrical power generating circuitry are locally contained on the two-axis tracker mechanism. Each of the photovoltaic arrays is configured with a global positioning system (GPS) circuitry to provide position information of the respective photovoltaic array at the solar site. Each of the photovoltaic arrays is configured with wireless communication circuitry to communicate information associated with the respective photovoltaic array to the central backend management system 250.

A user may use a client computing system 205 or 210 to connect to the central backend management system 250 to manage the solar site 215 and/or the solar site 220. Each of the client computing systems 205, 210 may be associated with a browser software to enable the users to use the Internet to access webpages associated with the central backend management system 250. There may be a firewall 206 or 211 associated with each of the client computing systems 205 and 210.

The central backend management system 250 may be configured to provide a large scale management system for monitoring and controlling many solar sites. From anywhere, a user with authorization and privileges can connect to the network 202 and monitor and control the paddles and solar site where the paddles are located. Each solar site may also have a video camera configured to provide information about what is happening at the solar site. The central backend management system 250 may use software as a service type model with secure networking to allow remote controlling and monitoring of the components at the solar site over the Internet. The software as a service can be software that is deployed over the Internet and is deployed to run behind a firewall on a private network. With the software as a service, application and data delivery is part of the utility computing model, where all of the technology is in the "cloud" accessed over the Internet as a service. The central backend management system may be associated with a database, which may be configured to store information received from the various solar sites.

Using the client computing system 210, a user may be able to view information about the solar site including, for example, the signal strength of the wireless router for every CPV array, the temperature of the inverter board, the position of every axis for every CPV array in relation to the sun, whether each axis of a CPV array is tracking or not and the accuracy of the tracking, the date and time when the tracker of a CPV array was last calibrated, basic predefined graphs on the portfolio, site, section, and array or string dashboard as a graph for a certain time period (e.g., one hour, one day, one week, one month, one year, etc.), the energy production performance as related to all the strings of a CPV array or all the substrings of a string, etc.

Concentrated Photovoltaic (CPV) Array at a Solar Site

Figure 3A:
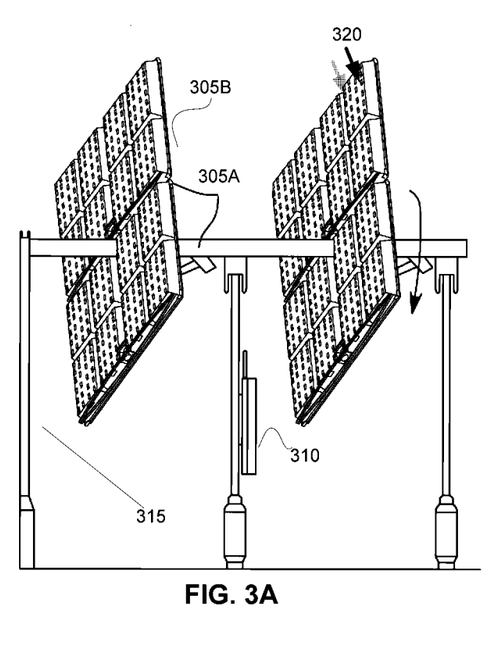
FIGS. 3A, 3B, and 3C illustrate diagrams of an embodiment of a pair of concentrated photovoltaic (CPV) paddle assemblies that may be installed at a solar site.
Figure 3B:
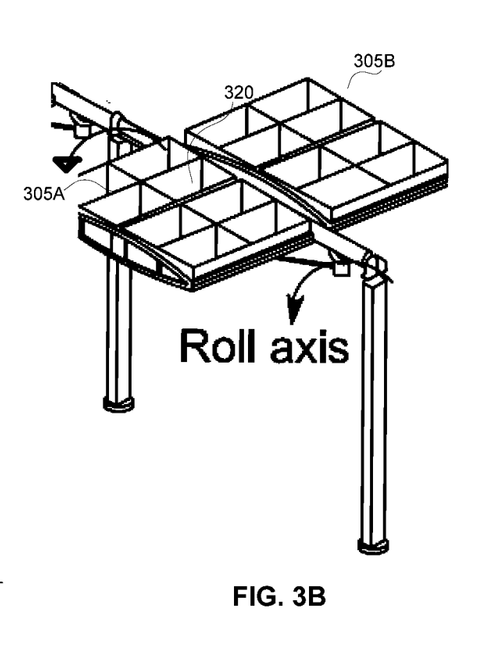
Figure 3C:
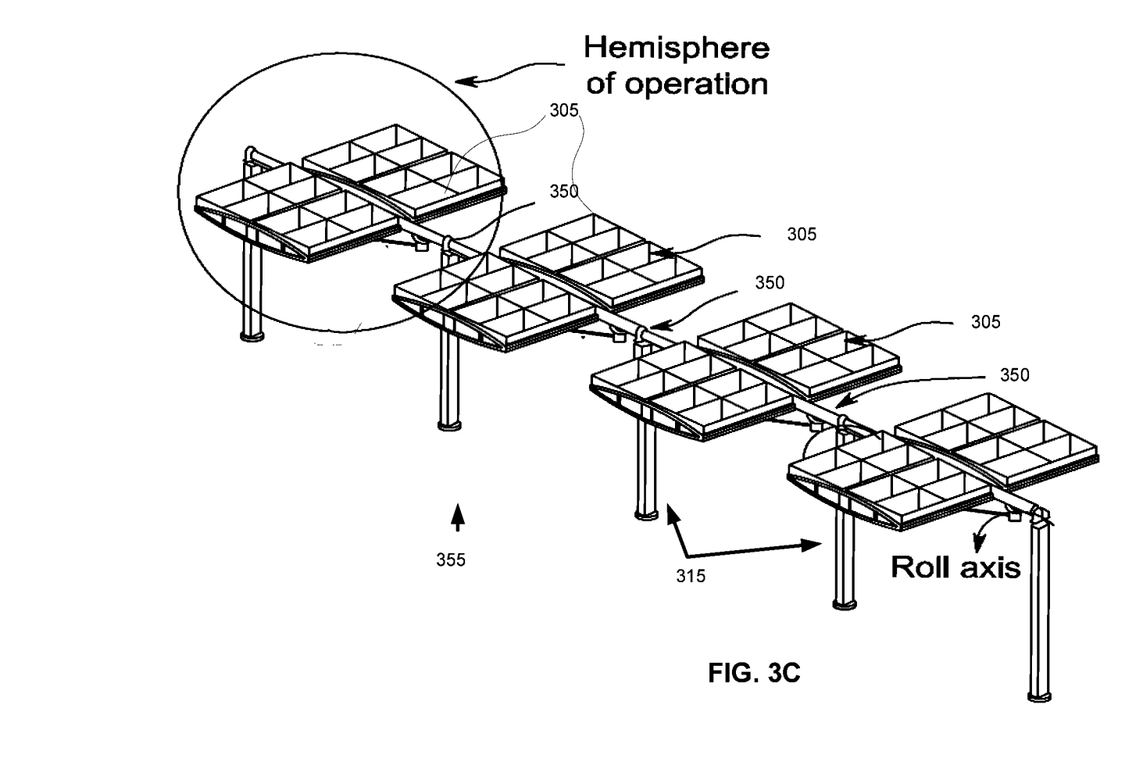

FIGS. 3A, 3B, and 3C illustrate diagrams of an embodiment of a pair of concentrated photovoltaic (CPV) paddle assemblies that may be installed at a solar site. Illustrated in FIG. 3A is a paddle pair 305A and 305B which has its own section of roll beam and own tilt axle. This may allow independent movement and optimization of the paddle pair 305A, 305B with respect to other paddle pairs in a tracker assembly. The movement of the paddle pair 305A, 305B may be limited within an operational envelope. The paddle pair 305A, 305B may be supported by a stanchion 315 and may be associated with an integrated electronics housing of a local system control point (SCP) 310. As illustrated in FIG. 3B, each of the paddles 305A, 305B may include eight (8) modules of CPV cells 320. The module may be the smallest field replaceable unit of the CPV paddle 305A or 305B. The paddles 305A, 305B and their respective modules may be assigned manufacturing data when they were manufactured. When the paddles 305A, 305B and their respective modules are installed in a solar site, their position information and associated manufacturing data may be recorded and stored in a manufacturing data database. The manufacturing data database may be associated with the central backend management system 250.

Illustrated in FIG. 3C is one 16 Kilowatts (KW) CPV solar array that includes eight (8) CPV paddle assemblies 305 mounted on four (4) tilt axle and a common roll beam assembly 350. As illustrated, the tracker assembly 355 is supported by five (5) stanchions, including the three shared stanchions in the middle and a non-shared stanchion at each end. At the shared and non-shared stanchions, the ends of the conical roll beams of each roll beam couple, for support, into the roller bearings. The tracker assembly 355 includes the conical shaped sections of roll beam (fixed axle) with multiple paddle-pair tilt-axle pivots perpendicular to the roll beam.

The CPV paddle assemblies 305 are associated with the SCP 310. In general, there may be one SCP for each CPV paddle assembly (also referred to as a CPV array). For some embodiments, the SCP 310 may include motion control circuits, inverters, ground fault circuits, etc. The SCP 310 may be an integrated electronics housing that is a weather-tight unit that controls the movement of the tracker assemblies 355, receives DC power from the modules, converts the DC power to AC power, sends the AC power to a power grid, and collects and reports performance, position, diagnostic, and weather data to the central backend management system.

Tracker Assembly for a CPV Array at a Solar Site

Figure 4:
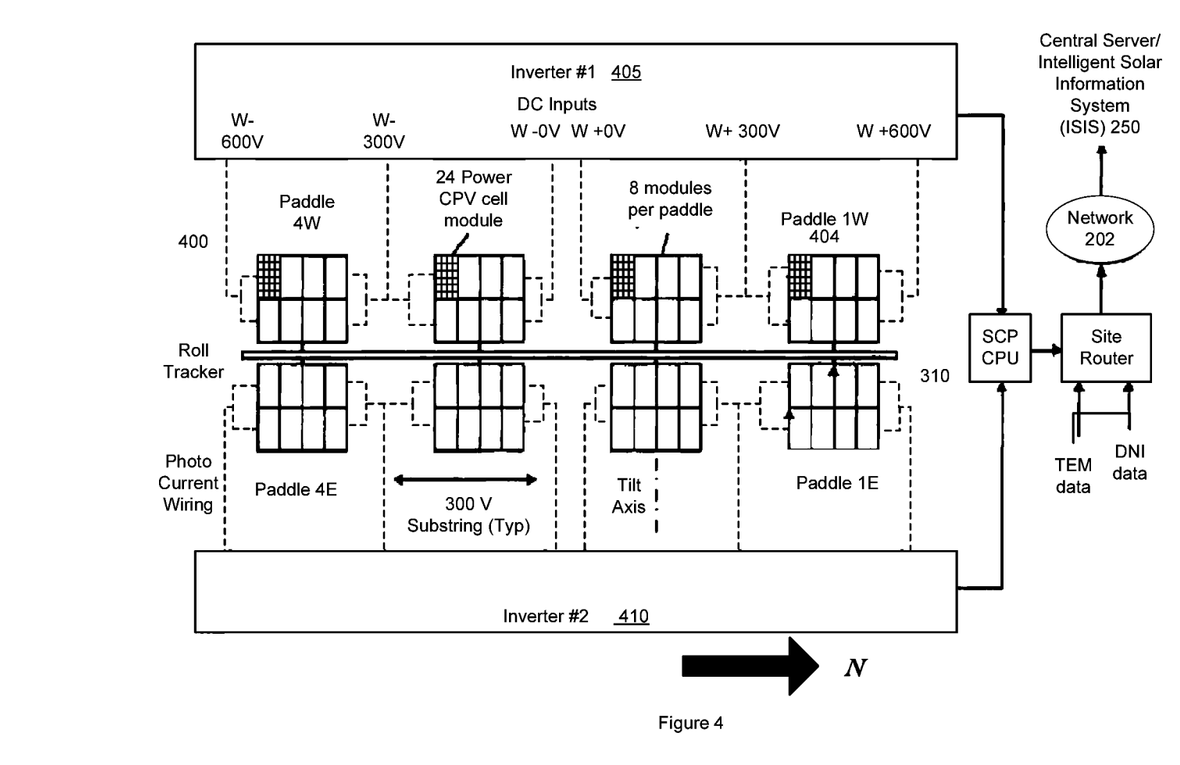
FIG. 4 illustrates a diagram of an embodiment of the physical and electrical arrangement of modules in a representative tracker assembly.

FIG. 4 illustrates a diagram of an embodiment of the physical and electrical arrangement of modules in a representative tracker assembly. In diagram 400, there is one CPV array with eight paddles 430 and two inverters 405 and 410. There are also twenty-four power units per module, eight modules per paddle, two paddles per tilt axis, and four independently-controlled tilt axes per common roll axis. The bi-polar voltage from the set of paddles may be, for example, a +600 VDC and a −600 VDC making a 1200 VDC output coming from the CPV modules. The CPV module array may be a string/row of PV cells arranged in an electrically series arrangement of two 300 VDC panels adding together to make the +600 VDC, along with two 300 VDC panels adding together to make the −600 VDC. Also illustrated in FIG. 4 are the SCP 310, the network or the cloud 202, and a router 415. As will be described with FIG. 5, wireless communication is used to transmit information between the SCP 310 and the router 415. It may be noted that the router 415 also receives direct normal irradiation (DNI) data 420 and temperature/weather data 425. It may also be noted that the central backend management system 250 illustrated in FIG. 2 may also be referred to as an Intelligent Solar Information System (ISIS) 250. The CPV paddles may be arranged in a North South direction, and the CPV modules may be arranged in an East West direction.

Local Area Network (LAN) at a Solar Site

Figure 5:
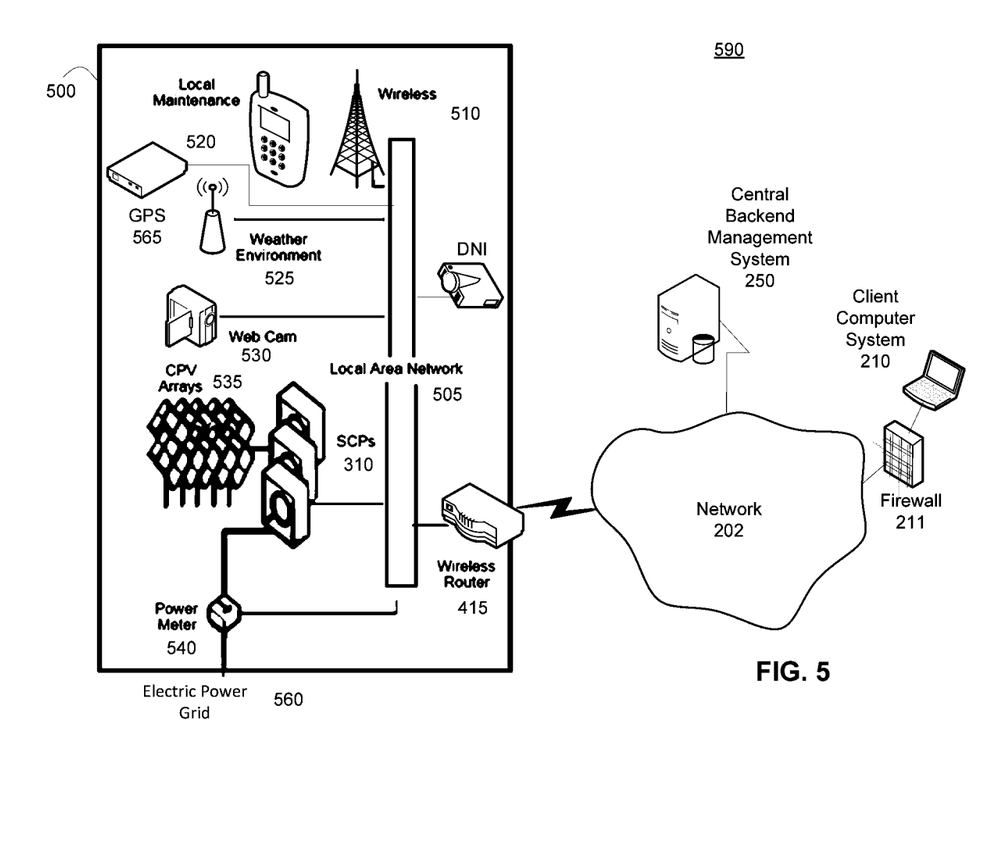
FIG. 5 illustrates diagrams of an embodiment of a solar site with multiple CPV arrays.

FIG. 5 illustrates diagrams of an embodiment of a solar site with multiple CPV arrays. Solar site 500 may include a local area network (LAN) 505. Connected to the LAN 505 is radio assembly 510, GPS 565, maintenance hand-held device 520, camera 530, SCPs 310, weather station 525, and power meter 540.

The SCPs 310 are located on the CPV arrays 535. As illustrated in FIG. 3C, there may be one SCP 310 for each of the CPV arrays 535. Each CPV array 535 may include eight (8) paddles, and there may be eight (8) modules per paddle. The SCP 310 may include motion control logic, inverter logic, etc. For example, the motion control logic may allow transitioning the paddles from an operational mode to a stow mode to prevent damage in adverse weather condition (e.g., gust wind, storm, etc.), and the inverter logic may allow converting DC power to AC power. A module in a single SCP may be configured to continuously monitor a local weather station relative to that solar site and broadcast the weather across the LAN to the rest of the SCPs.

For some embodiments, a secured communication channel using Hypertext Transfer Protocol Secure (HTTPS) may be used for transmitting information between the SCP 310 and the ISIS 250 over the network 202. The SCP 310 may use HTTPS POST to send performance data to the ISIS 250. The SCP 310 may ping the ISIS 250 every time period (e.g., one minute) even when the SCP 310 has no data to report. For some embodiments, the ISIS 250 may respond with acknowledgement in response to the HTTP POST and can optionally send commands to the SCP 310, requests the SCP 310 to maintain a more frequent or permanent connection, throttle the speed of the SCP messages, etc.

For some embodiments, the SCP 310 only has outbound connections and no inbound open connection ports. The SCP 310 may control all the traffic that is sent to the ISIS 250. The SCP 310 communicates with all of the other devices (e.g., camera 530, GPS 365, etc.) connected to the LAN 505 and polls data from these devices. The SCP 310 may be associated with a network name and a MAC address, and the SCP 310 may be registered with an on-site DNS server. At predetermined time intervals, the SCP 310 may send power performance data, motion control data, image data, weather data, direct normal irradiation (DNI) data from the Normal Incidence Pyrheliometer (NIP), etc. to the ISIS 250. The SCP 310 may include wireless circuitry to transmit information to the ISIS 250 using wireless communication via the wireless router 415.

The LAN allows faster communications between the devices located at the solar site than when those devices communicate over the Internet with the central backend management system. The LAN also include one device at the site that can provide its information or functionality across the LAN to all of the two-axis tracker mechanisms located at that solar site.

Thus, as discussed above, measured parameters common across the solar site, including direct normal incidence (DNI) and local weather, are 1) detected by a local detector, 2) retrieved by a local device or 3) a combination of both, and then broadcast as internal solar site communications over the LAN to all of the different SCPs at the site. The communications are faster and more reliable because Internet access to such information may occasionally become unavailable from time to time. Also, the measured parameters common across the solar site need only a single detector device rather than one device per two-axis tracker mechanism.

A large number of software packages are resident and hosted in the SCP 310. Some of these may include SCP bi-directionally messaging posts in XML to the HTTP(s) server, SCP initiating requests to be commissioned, SCP creating a TLS socket connection to Socket Dock and streams XML, SCP accepting the TLS socket connection to receive XML commands, and many others. The software packages may also be a combination of hardware logic working with software coded instructions.

The local video camera 530 is mounted to survey the plurality of CPV arrays and capture images at the site 500. The images captured by the camera 530 may be polled by the SCP 310 at predetermined time intervals. It may be noted that the camera 530 can be configured to not send the images to the SCP 310 until the SCP 310 asks for them. The images may then be sent by the SCP 310 to the ISIS 250. The image format of the camera 530 may need to be converted into an XML supported format (e.g., base64) and sent to the ISIS 250 with the data-protocol framework. The images may be time-stamped with the same clock as all of the other SCP data. This allows the ISIS 250 to correlate the images and the performance data of the various CPV arrays 535. For some embodiments, when the network 202 is not available, the SCP 310 may buffer the image data and send them to the ISIS 250 when the network 202 becomes available. The SCP 310 may send the images to the ISIS 250 at certain time interval (e.g., every five seconds). The images may be stored by the ISIS 250 in the associated database. For example, the stored images may be used to correlate with power/energy performance data during problem determination. There may be one or more camera 530 at the solar site 500. When there are multiple cameras 530, the images captured by each camera may be polled by a different SCP.

Each of the CPV arrays 535 may be associated with a GPS 565. The GPS 565 is configured to provide positioning information for the associated CPV array 535 including the longitude and latitude or coordinate information. For example, in commissioning a CPV array 535, the SCP 310 may extract the positioning information from the GPS 565 and transmit it to the ISIS 250. For some embodiments, the logic for the GPS 565 may be built into the SCP 310.

The weather station 525 may be used to collect local weather information at the solar site 500. That weather information may be collected by the SCP 310 and then transmitted to the ISIS 250. A solar power meter may be on site connect to a SCP or wirelessly itself in communication with the LAN to measure an amount of DNI and broadcast updates of the measured amount of DNI and the time of that measurement, all of which are communicated over the LAN to the other SCPs and back to the central backend management system. The weather measuring equipment such as Air flow velocity anemometers, the solar power meter, and other similar instruments may direct connect into a couple of SCP local at the site. These SCP act as master and backup sources to provide this information wirelessly to the LAN. The local instruments information may then be broadcast to all of the SCP's at the site to allow a the couple local instruments supply their information to all of the SCPs at the site. For example, all of the SCP's may go into emergency stow mode based on the local anemometer connected to a first SCP and broadcast across the LAN to the rest of the SCPs. All of which occurs without the central backend management server system having to collect the wind speeds and send the appropriate commands to each of the SCPs at the site to enter stow mode. Likewise, on the DNI measurements used in the power calculations, the first SCP and broadcast across the LAN to the rest of the SCPs, and each SCP uses the DNI in its calculations without the time lag of the central backend management server system having to collect the DNI information and send the appropriate information to each of the SCPs at the site. Local operators may use the maintenance hand-held device 520 to communicate with the other devices in the LAN 505. The power meter 540 is coupled to a power station 560 and is configured to measure power generated by the CPV arrays 535 and distributed to the power grid 560. The power grid 560 may be associated with a client who purchases the power generated by the solar site 500. In this example, the client is Pacific Gas and Electric Company (PG&E). The solar site 500 may include one site wireless router 415 and one or more radio assemblies 510 to enable the SCP 310 to communicate with the ISIS 250.

Wireless Communication Set Up at a Solar Site

Figure 6:
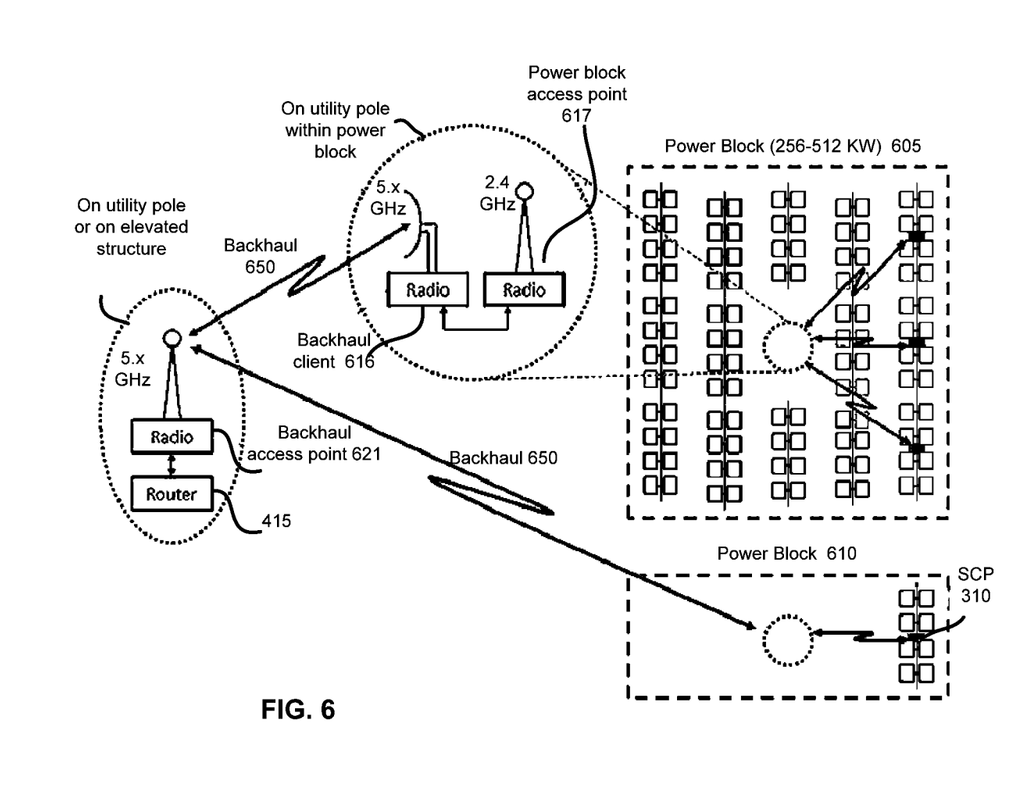
FIG. 6 illustrates a diagram of an embodiment of a wireless communication set up at a solar site.

FIG. 6 illustrates a diagram of an embodiment of a wireless communication set up at a solar site. The solar site 500 may include multiple power blocks 605, 610. The power block 605 may be associated with a LAN 505 and may include multiple CPV arrays 535. The power block 605 may also be associated with the radio assembly 510, illustrated in FIG. 5. The radio assembly 510 (also referred to as a power block radio assembly 510) may be installed on a utility pole within the power block 605. For some embodiments, the radio assembly 510 may include a power block access point 617 and a back haul client 616 and an enclosure that contains connect for radio. The enclosure may include wiring connector, AC outlets, etc. and may be mounted at the bottom of the utility pole. The power block access point 617 may be a 2.4 GHz wireless access point, and the back haul client 616 may be a 5 GHz wireless access point. The antennas associated with the power block access point 617 and the back haul client 616 may be mounted onto a yardarm that is mounted at the top of the utility pole with network cables running from the enclosure from the bottom to the top of the utility pole.

The solar site 500 may also include a backhaul radio assembly 620, which may be installed on a utility pole or an elevated structure. The backhaul radio assembly 620 may include a backhaul access point 621 and the router 415. The backhaul access point 621 is coupled with the backhaul client 616 from each of the power blocks 605, 610 in the solar site 500 over a backhaul network 650. For example, the information collected by the SCP 310 from one or more of the devices connected to the LAN 505 may be transmitted from the SCP 310 using its internal wireless circuitry to the power block radio assembly 510, over the backhaul network 650, to the backhaul radio assembly 620 and its router 415, to the network 202, and to the ISIS 250.

From behind a firewall, the SCP 310 calls over the network 202 to the ISIS 250. The SCP 310 may then maintain this communication open, i.e. the socket connection until the protocol specific end tag is received. This creates a persistently open outbound connection coming from the SCP 310 out to the ISIS 250 to work around the firewall at the SCP 310. From a high level, the SCP command architecture is a HTTPS client/server that exchanges XML messages constrained by a specific schema. The ISIS 250 sends XML commands through a TLS encrypted channel and expects XML responses from the SCP 310. Both the ISIS 250 and the SCP 310 follow the HTTPS protocol requiring the appropriate headers.

Automatic Configuration Flow Diagram

Figure 7:
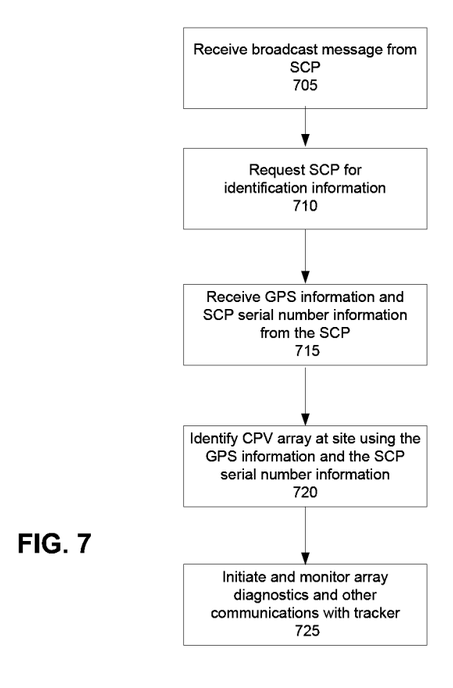
FIG. 7 is a flow diagram that illustrates an embodiment of commissioning a CPV array.

FIG. 7 is a flow diagram that illustrates an embodiment of an auto-configuration process for each of the CPV arrays installed in the solar site based upon the Global Positioning System coordinates of each of the CPV arrays. When a new CPV array and SCP are installed in the solar site 500, the installation team may record the serial number of the SCP as well as the manufacturing data of all of the components of the associated CPV array. This may include, for example, the serial numbers of the inverters, the motors, the modules, etc. This may also include the manufacturing date and "as built" output voltage level of the modules since each of the modules may have a different output. Reference coordinate information (e.g., the latitude and longitude information) of the CPV array may also be determined. The information recorded by the installation team may be uploaded and stored in the database associated with the ISIS 250.

The process of FIG. 7 may start with the SCP 310 being powered on and generating a "hello" message that is received by the ISIS 250, as shown in block 705. The "hello" message may be a broadcast message sent by the SCP 310 to announce its presence in the network. The "hello" message may be a broadcast at the start up of the SCP on the two-axis tracker mechanism. At certain point, the "hello" message is received by the ISIS 250. The ISIS 250 may be configured to perform operations to determine the identity of the sender of the "hello" message. At block 710, the ISIS 250 requests the SCP 310 to send its identification information. At block 715, the ISIS 250 may receive the serial number information of the SCP 310 and the GPS information of the CPV array that the SCP 310 is associated with. The ISIS central backend management system 250 receives the GPS information indicating a precise geographic position of each two-axis tracker mechanism over the wireless communication network to a wireless router located at the solar site and then over the Internet to this central backend management system 250. The GPS information may be generated by a global position system (GPS) circuitry built into each of the two-axis tracker mechanisms. The ISIS central backend management system 250 receives the GPS information along with serial number information from each of the two-axis tracker mechanisms. The serial number information is unique to one or more of the components that are part of a two-axis tracker mechanism when the component is manufactured. Thus, the serial number information of the SCP 310 is a unique number that distinguishes the SCP 310 from any other SCPs in the solar site. The GPS information may be stored in the database associated with the ISIS 250. The ISIS 250 may use any combination of the serial number and the GPS coordinates from that two-axis tracker mechanism as the identifier for which two-axis tracker mechanism is sending that information At block 720, the ISIS 250 may identify the CPV array being commissioned by comparing its geographical coordinates to the reference coordinates. The ISIS 250 may also map the SCP serial number received from the SCP and the SCP serial number recorded by the field installation team to identify the paddles that are installed in the CPV array. Thus, the central backend management system can perform two or more mappings including: 1) using the Latitude and a Longitude information to identify each CPV array's geographical position in the set of arrays at the site relative to other CPV arrays located at that solar site; and 2) storing and recording in the database the serial number and the GPS coordinates from each two-axis tracker mechanism at the solar site to use any combination of the serial number and the GPS coordinates from a given two-axis tracker mechanism as identifiers for which two-axis tracker mechanism is sending a communication. At block 725, the ISIS 250 may send configuration information to the SCP 310 and it can then start to monitor the SCP 310 and its associated CPV array. Thus, the ISIS central backend management system 250 sends auto-configuration files over the Internet to each of the two-axis tracking mechanisms installed at the solar site based upon the GPS coordinates of each of the two-axis tracking mechanisms and that two-axis tracking mechanism's relative position in the layout of the two-axis tracking mechanisms located at the solar site. After the SCP 310 is configured, the ISIS 250 may enable a user to observe what is happening to each of the components of the CPV array in the solar site 500. For example, the user may be able to compare actual performance data of the CPV array with the manufacturing test data to determine faulty parts. The user may be able to view the power data for the CPV array and the actual weather conditions at the solar site. The user may also be able to view the actual field performance power data with the predicted power as determined by the manufacturer for comparison. The user may be able to compare parameters from the paddles of one CPV array to the parameters of paddles of neighboring CPV arrays.

With reference to FIG. 1, for some embodiments, computing system environment 100 may be used by a client to access, control, and manage solar-related resources at one or more solar sites from a remote location. As will be described, the solar site may include many solar arrays, modules, paddles, tracker axis, etc. A client or user may use the computing system environment 100 to connect to a central backend management system over a network such as the Internet.

The computing system environment 100 is only one example of a suitable computing environment, such as a client device, and is not intended to suggest any limitation as to the scope of use or functionality of the design. Neither should the computing system environment 100 be interpreted as having any dependency or requirement relating to any one or combination of the illustrated components.

The design is operational with numerous other general purpose or special purpose computing system environments or configurations. Examples of well-known computing systems, environments, and/or configurations that may be suitable for use with the design include, but are not limited to, personal computers, server computers, hand-held or laptop devices, multiprocessor systems, microprocessor-based systems, set top boxes, programmable consumer electronics, network PCs, minicomputers, mainframe computers, distributed computing environments that include any of the above systems or devices, and the like.

The design may be described in the general context of computing device executable instructions, such as program modules, being executed by a computer. Generally, the program modules include routines, programs, objects, components, data structures, etc., that perform particular tasks or implement particular abstract data types. Those skilled in the art can implement the description and/or figures herein as computer-executable instructions, which can be embodied on any form of computing machine readable media discussed below.

The design may also be practiced in distributed computing environments where tasks are performed by remote processing devices that are linked through a communications network. In a distributed computing environment, program modules may be located in both local and remote computer storage media including memory storage devices.

With reference to FIG. 1, an exemplary computing type system for implementing the design includes a general-purpose computing device in the form of a computing device 110. Components of computing device 110 may include, but are not limited to, a processing unit 120 having one or more processing cores, a system memory 130, and a system bus 121 that couples various system components including the system memory to the processing unit 120. The system bus 121 may be any of several types of bus structures including a memory bus or memory controller, a peripheral bus, and a local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) locale bus, and Peripheral Component Interconnect (PCI) bus.

Computing device 110 typically includes a variety of computing machine readable media. Computing machine-readable media can be any available media that can be accessed by computing device 110 and includes both volatile and nonvolatile media, removable and non-removable media. By way of example, and not limitation, computing machine-readable mediums uses include storage of information, such as computer readable instructions, data structures, program modules or other data. Computer storage mediums include, but are not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by the computing device 110. Communication media typically embodies computer readable instructions, data structures, program modules, or other transport mechanism and includes any information delivery media.

The system memory 130 includes computer storage media in the form of volatile and/or nonvolatile memory such as read only memory (ROM) 131 and random access memory (RAM) 132. A basic input/output system 133 (BIOS), containing the basic routines that help to transfer information between elements within computing device 110, such as during start-up, is typically stored in ROM 131. RAM 132 typically contains data and/or program modules that are immediately accessible to and/or presently being operated on by processing unit 120. By way of example, and not limitation, FIG. 1 illustrates operating system 134, application programs 135, other program modules 136, and program data 137.

The computing device 110 may also include other removable/non-removable volatile/nonvolatile computer storage media. By way of example only, FIG. 1 illustrates a hard disk drive 141 that reads from or writes to non-removable, nonvolatile magnetic media, a magnetic disk drive 151 that reads from or writes to a removable, nonvolatile magnetic disk 152, and an optical disk drive 155 that reads from or writes to a removable, nonvolatile optical disk 156 such as a CD ROM or other optical media. Other removable/non-removable, volatile/nonvolatile computer storage media that can be used in the exemplary operating environment include, but are not limited to, USB drives and devices, magnetic tape cassettes, flash memory cards, digital versatile disks, digital video tape, solid state RAM, solid state ROM, and the like. The hard disk drive 141 is typically connected to the system bus 121 through a non-removable memory interface such as interface 140, and magnetic disk drive 151 and optical disk drive 155 are typically connected to the system bus 121 by a removable memory interface, such as interface 150.

The drives and their associated computer storage media discussed above and illustrated in FIG. 1, provide storage of computer readable instructions, data structures, program modules and other data for the computing device 110. In FIG. 1, for example, hard disk drive 141 is illustrated as storing operating system 144, application programs 145, other program modules 146, and program data 147. Note that these components can either be the same as or different from operating system 134, application programs 135, other program modules 136, and program data 137. Operating system 144, application programs 145, other program modules 146, and program data 147 are given different numbers here to illustrate that, at a minimum, they are different copies.

A user may enter commands and information into the computing device 110 through input devices such as a keyboard 162, a microphone 163, and a pointing device 161, such as a mouse, trackball or touch pad. Other input devices (not shown) may include a joystick, game pad, satellite dish, scanner, or the like. These and other input devices are often connected to the processing unit 120 through a user input interface 160 that is coupled to the system bus, but they may be connected by other interface and bus structures, such as a parallel port, game port or a universal serial bus (USB). A monitor or display 191 or other type of display device is also connected to the system bus 121 via an interface, such as a video interface 190. In addition to the monitor, computers may also include other peripheral output devices such as speakers 197 and printer 196, which may be connected through an output peripheral interface 190.

The computing device 110 may operate in a networked environment using logical connections to one or more remote computers, such as a remote computer 180. The remote computer 180 may be a personal computer, a hand-held device, a server, a router, a network PC, a peer device or other common network node, and typically includes many or all of the elements described above relative to the computing device 110. The logical connections depicted in FIG. 1 include a local area network (LAN) 171 and a wide area network (WAN) 173, but may also include other networks. Such networking environments are commonplace in offices, enterprise-wide computer networks, intranets and the Internet. A browser application may be resident on the computing device and stored in the memory.

When used in a LAN networking environment, the computing device 110 is connected to the LAN 171 through a network interface or adapter 170. When used in a WAN networking environment, the computing device 110 typically includes a communication module 172 or other means for establishing communications over the WAN 173, such as the Internet. The communication module 172 may be a modem used for wired, wireless communication or both. The communication module 172 may be internal or external, may be connected to the system bus 121 via the user-input interface 160, or other appropriate mechanism. In a networked environment, program modules depicted relative to the computing device 110, or portions thereof, may be stored in the remote memory storage device. By way of example, and not limitation, FIG. 1 illustrates remote application programs 185 as residing on remote computer 180. It will be appreciated that the network connections shown are exemplary and other means of establishing a communications link between the computers may be used.

It should be noted that the present design can be carried out on a computing system such as that described with respect to FIG. 1. However, the present design can be carried out on a server, a computer devoted to message handling, or on a distributed system in which different portions of the present design are carried out on different parts of the distributed computing system.

Another device that may be coupled to bus 111 is a power supply such as a battery and alternating current (AC) adapter circuit. As discussed above, the DC power supply may be a battery, a fuel cell, or similar DC power source that needs to be recharged on a periodic basis. For wireless communication, the communication module 172 may employ a Wireless Application Protocol to establish a wireless communication channel. The communication module 172 may implement a wireless networking standard such as Institute of Electrical and Electronics Engineers (IEEE) 802.11 standard, IEEE std. 802.11-1999, published by IEEE in 1999.

While other systems may use, in an independent manner, various components that may be used in the design, a comprehensive, integrated system that addresses the multiple advertising system points of vulnerability described herein does not exist. Examples of mobile computing devices may be a laptop computer, a cell phone, a personal digital assistant, or other similar device with on board processing power and wireless communications ability that is powered by a Direct Current (DC) power source that supplies DC voltage to the mobile device and that is solely within the mobile computing device and needs to be recharged on a periodic basis, such as a fuel cell or a battery.

Although the foregoing embodiments have been described in some detail for purposes of clarity of understanding, the invention is not limited to the details provided. The CPV array may be organized into one or more paddle pairs. CPV modules on the West side and East side may supply different amounts of voltage or current. Functionality of circuit blocks may be implemented in hardware logic, active components including capacitors and inductors, resistors, and other similar electrical components. There are many alternative ways of implementing the invention. The disclosed embodiments are illustrative and not restrictive.

We claim:

1. A concentrated photovoltaic (CPV) array management system, comprising:
    a plurality of concentrated photovoltaic (CPV) arrays located at a solar site, each of the CPV arrays is coupled with a different system control point (SCP) communicatively connected to a local area network (LAN) for that solar site,
    wherein a first CPV array is contained on a first two-axis tracker mechanism, wherein the two-axis tracker mechanism has a housing for a first SCP that also includes tracker motion control circuitry and electrical power generating circuitry that generates alternating current (AC) voltage output,
    wherein the first CPV array is associated with a first global positioning system (GPS) circuitry which is configured to provide position information of the first CPV array at the solar site,
    wherein the housing for the first SCP also includes built-in wireless communication circuitry, wherein at least the motion control, electrical power generation and GPS circuits associated with the first SCP are configured to communicate information about the first CPV array and two-axis tracker mechanism to a central backend management system over an Internet via a wireless router for the LAN located at the solar site, and
    wherein a second CPV array on a second two-axis tracker mechanism that has its own second SCP configured with built-in wireless communication circuitry, wherein at least a motion control, electrical power generation and GPS circuits associated with the second SCP are configured to communicate information about the second CPV array and two-axis tracker mechanism to the central backend management system over the Internet via the wireless LAN.

2. The system of claim 1, wherein communication between the first or the second SCP and the central backend management system is configured to use a secured communication channel, including a secured communication channel that uses Hypertext Transfer Protocol Secure (HTTPS) commands.

3. The system of claim 1, where the LAN communicates measured parameters common across the solar site, including direct normal incidence (DNI) and local weather, which are 1) detected by a local detector, 2) retrieved by a local device or 3) a combination of both, and then broadcast as internal solar site communications over the LAN to the different SCPs.

4. The system of claim 3, wherein the first CPV array is associated with a local video camera mounted to survey the plurality of CPV arrays, a module configured to continuously monitor a local weather station relative to that solar site, and a solar power meter to measure an amount of DNI and broadcast updates of the measured amount of DNI and the time of that measurement, all of which are communicated over the LAN.

5. The system of claim 3, wherein the first SCP is configured to transmit (a) the position information coming from the GPS circuitry, (b) image information from a video camera monitoring the solar site, (c) local weather information from a weather station, (d) solar power information from a power meter on site, (e) tracker motion control information for each two-axis tracker mechanism, and (f) electrical power generating information from each of the plurality of CPV arrays to the central backend management system over the Internet via the wireless router.

6. The system of claim 1, wherein the first SCP is associated with a power block which includes a power block radio assembly, the power block radio assembly including a power block access point coupled with a backhaul client, and wherein a first wireless communication connection is established between the built-in wireless communication circuitry of the first SCP and the power block access point to enable the first SCP to communicate with the central backend management system.

7. The system of claim 6, wherein the solar site includes a backhaul radio assembly which includes a wireless router coupled with a backhaul access point, the wireless router coupled to the Internet, wherein a second wireless communication connection is established between the backhaul client of the power block radio assembly and the backhaul access point of the backhaul radio assembly to enable the first SCP to communicate with the central backend management system.

8. A method for performing auto-configuration of a concentrated photovoltaic (CPV) array installed in a solar site having multiple CPV arrays based upon the Global Positioning System coordinates of each of the CPV arrays, the method comprising:
    receiving Global Positioning System (GPS) information indicating a precise geographic position of a first two-axis tracker mechanism over a wireless communication network to a wireless router located at the solar site and then over the Internet to a central backend management system, wherein the GPS information is generated by a global position system (GPS) circuitry built into the first two-axis tracker mechanism, wherein a first CPV array is contained on the first two-axis tracker mechanism;
    receiving along with the GPS information, serial number information from the first two-axis tracker mechanism, the serial number information being unique to one or more of the components that are part of a two-axis tracker mechanism when the component is manufactured;
    receiving GPS information indicating a precise geographic position of a second two-axis tracker mechanism, in a set of CPV arrays at the solar site that contains the first and second two-axis tracker mechanisms, over the wireless communication network to the wireless router located at the solar site and then over the Internet to the central backend management system, wherein a second CPV array is contained in the second two-axis tracker mechanism;
    receiving along with the GPS information, serial number information from the second two-axis tracker mechanism, the serial number information being unique to one or more of the components that are part of a given two-axis tracker mechanism when the component is manufactured;
    identifying by the central backend management system each CPV array's geographical position in the set of arrays at the site relative to other CPV arrays located at that solar site by a Latitude and a Longitude being transmitted from the GPS circuitry built into that two-axis tracking mechanism; and sending auto-configuration files over the Internet by the central backend management system to the two-axis tracking mechanisms installed at the solar site based upon the GPS coordinates of each of the two-axis tracking mechanisms and that two-axis tracking mechanism's relative position in the layout of the two-axis tracking mechanisms located at the solar site.

9. The method of claim 8, further comprising:

receiving status and diagnostic information over the Internet from the electronic circuits on the two-axis tracking mechanism and using any combination of the serial number and the GPS coordinates from that two-axis tracker mechanism as the identifier for which two-axis tracker mechanism is sending that information.

10. The method of claim 8, where the central backend management system performs two mappings: 1) using the Latitude and the Longitude information to identify each CPV array's geographical position in the set of arrays at the site relative to other CPV arrays located at that solar site; and 2) storing and recording in the database the serial number and the GPS coordinates from each two-axis tracker mechanism at the solar site to use any combination of the serial number and the GPS coordinates from a given two-axis tracker mechanism as identifiers for which two-axis tracker mechanism is sending a communication.

11. The method of claim 10, further comprising:

identifying a System Control Point and the associated CPV array based on the GPS information and the serial number information of the SCP and based on information stored in the database associated with the central backend management system; and wherein the database associated with the central backend management system is configured to store information about all SCPs and their associated CPV arrays as installed at the solar site.

12. The method of claim 11, wherein the information about all of the SCPs and their associated CPV arrays includes information assigned by their manufacturers.

13. The method of claim 9, wherein the status and diagnostic information includes information from the SCP, its associated CPV array and information of components of the CPV array, and wherein the status and diagnostic information is exchanged using Hypertext Transfer Protocol Secure (HTTPS).

14. A solar system, comprising:

a wireless local area network (LAN) configured to enable information related to solar devices at a remote solar site to be transmitted to a central backend management system via an Internet, the solar devices connected to the wireless LAN and including a plurality of system control points (SCPs), wherein each of the SCPs is associated with a concentrated photovoltaic (CPV) array from a plurality of CPV arrays, wherein each of the SCPs is configured with built-in wireless communication circuitry and built-in global positioning system (GPS) circuitry, and wherein the information related to the solar devices includes information related to the SCPs and their associated CPV arrays, and wherein the information related to the solar devices is transmitted from the wireless LAN to the central backend management system using Hypertext Transfer Protocol Secure (HTTPS) POST commands and wireless communication via the built-in wireless communication circuitry of the SCPs, a power block radio assembly and a wireless router coupled to the Internet.

15. The solar system of claim 14, wherein the solar devices further includes a camera, a weather station, and a power meter, all connected to the wireless LAN, and wherein the information related to the solar devices includes image information captured by the camera, weather information gathered by the weather station, and power output information of the plurality of CPV arrays as measured by the power meter.

16. The solar system of claim 15, wherein each of the plurality of the CPV arrays is contained in a multiple-axis tracker mechanism that generates alternating current (AC) voltage output, wherein the two-axis tracker mechanism includes tracker motion control circuitry and electrical power generating circuitry.

17. The solar system of claim 16, wherein the information related to the solar devices includes motion control information associated with the tracker motion control circuitry and electrical power generating information associated with the electrical power generating circuitry.

18. The solar system of claim 14, wherein the information related to the solar devices is transmitted from the power block radio assembly to a backhaul radio assembly, wherein the backhaul radio assembly includes a backhaul access point and the wireless router.

19. The solar system of claim 18, wherein the power block radio assembly includes a power block access point and a backhaul client, wherein the backhaul client of the power block access point is coupled with the backhaul access point of the backhaul radio assembly to enable the information related to the solar devices to be transmitted to the central backend management system using the wireless communication.

* * * * *